United States Patent
Shimizu et al.

(10) Patent No.: US 8,525,041 B2
(45) Date of Patent: Sep. 3, 2013

(54) MULTILAYER WIRING BOARD AND METHOD FOR MANUFACTURING THE SAME

(75) Inventors: Keisuke Shimizu, Ogaki (JP); Yoichiro Kawamura, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 412 days.

(21) Appl. No.: 12/543,644

(22) Filed: Aug. 19, 2009

(65) Prior Publication Data
US 2010/0214752 A1 Aug. 26, 2010

Related U.S. Application Data

(60) Provisional application No. 61/154,081, filed on Feb. 20, 2009.

(51) Int. Cl.
*H05K 1/16* (2006.01)

(52) U.S. Cl.
USPC .......................................... 174/260; 174/262

(58) Field of Classification Search
None
See application file for complete search history.

(56) References Cited

U.S. PATENT DOCUMENTS

| | | | |
|---|---|---|---|
| 6,185,087 B1 * | 2/2001 | Park et al. ................. | 361/321.4 |
| 7,230,818 B2 * | 6/2007 | Noguchi et al. .............. | 361/528 |
| 7,417,299 B2 * | 8/2008 | Hu ................................ | 257/528 |
| 7,733,664 B2 * | 6/2010 | Ito et al. ........................ | 361/784 |
| 7,751,174 B2 * | 7/2010 | Kimura et al. .............. | 361/306.3 |
| 2005/0230835 A1 * | 10/2005 | Sunohara et al. ............. | 257/758 |
| 2008/0192450 A1 * | 8/2008 | Tuominen et al. ............ | 361/761 |
| 2010/0071944 A1 * | 3/2010 | Endo ............................. | 174/260 |

FOREIGN PATENT DOCUMENTS

| | | |
|---|---|---|
| JP | 2000-124615 | 4/2000 |
| JP | 2000-244127 | 9/2000 |
| JP | 2002-100875 | 4/2002 |
| JP | 2006-032887 | 2/2006 |
| JP | 2008-91603 | 4/2008 |

OTHER PUBLICATIONS

U.S. Appl. No. 12/490,409, filed Jun. 24, 2009, Kawamura, et al.
U.S. Appl. No. 12/489,803, filed Jun. 23, 2009, Shimizu, et al.
U.S. Appl. No. 12/498,813, filed Jul. 7, 2009, Shimizu, et al.

* cited by examiner

*Primary Examiner* — Ishwarbhai Patel
(74) *Attorney, Agent, or Firm* — Oblon, Spivak, McClelland, Maier & Neustadt, L.L.P.

(57) ABSTRACT

A wiring board has a substrate, a conductive pattern formed over the substrate, and an electronic component mounted to the substrate and having an electrode. The electrode of the electronic component is connected to the conductive pattern through a via hole. The thickness of the electrode of the electronic component is made less than the thickness of the conductive pattern.

16 Claims, 17 Drawing Sheets

FIG. 8
| sample | | Leg 1 | Leg 2 | Leg 3 | Leg 4 | Leg 5 | Leg 6 |
|---|---|---|---|---|---|---|---|
| warping | | absent | absent | absent | absent | concave | convex |
| T1 [$\mu$m] | | 25.0 | 12.5 | 6.25 | 3.13 | 12.5 | 12.5 |
| T2 [$\mu$m] | | 32.5 | 20.0 | 13.75 | 10.63 | 20.0 | 20.0 |
| equiv. stress [Pa] | upper | 1.53E-06 | 1.24E-06 | 1.06E-06 | 9.73E-07 | 1.48E-06 | 2.10E-06 |
| | lower | 9.40E-07 | 7.85E-07 | 6.50E-07 | 5.06E-07 | 7.04E-07 | 7.57E-07 |
| equiv. stress [%] (standard: Leg 2) | upper | 123% | 100% | 85% | 78% | 119% | 169% |
| | lower | 120% | 100% | 83% | 64% | 90% | 96% |
FIG. 9A
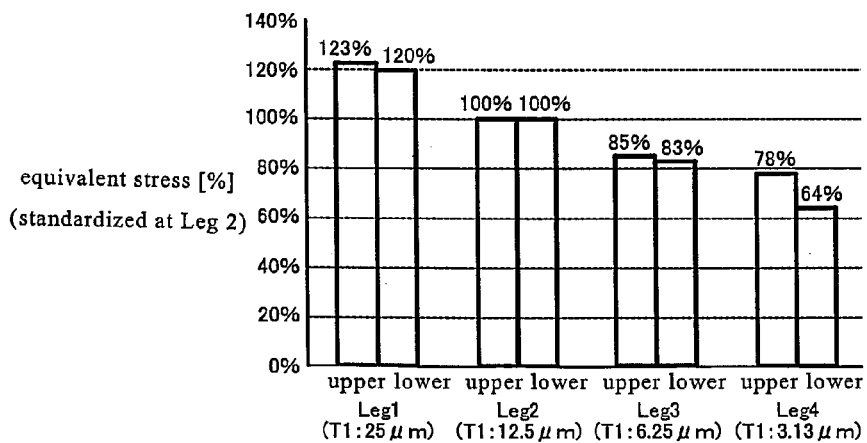
FIG. 9B
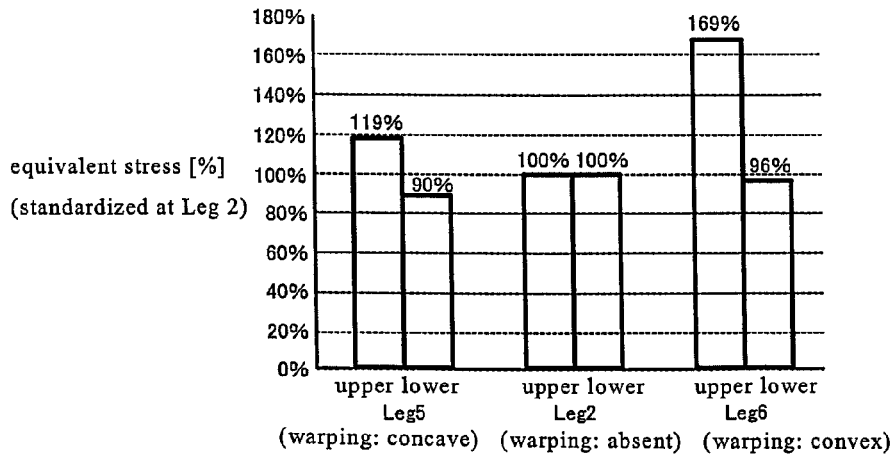

MULTILAYER WIRING BOARD AND METHOD FOR MANUFACTURING THE SAME

CROSS-REFERENCE TO RELATED APPLICATIONS

The present application claims the benefits of priority to U.S. Application No. 61/154,081, filed Feb. 20, 2009. The contents of that application are incorporated herein by reference in their entirety.

BACKGROUND OF THE INVENTION

1. Field of the Invention

The present invention is related to a wiring board with a built-in electronic component such as a resistor or capacitor and a method for manufacturing such a wiring board.

2. Discussion of the Background

In Japanese Laid-Open Patent Publication 2006-32887, a wiring board with a built-in electronic component and its manufacturing method are described. In such a manufacturing method, a production worker manufactures a wiring board with a built-in electronic component by embedding an electronic component into a substrate and electrically connecting a conductive pattern of the substrate and a terminal electrode (electrode pad) of the electronic component through a via hole.

The contents of this publication are incorporated herein by reference in their entirety.

SUMMARY OF THE INVENTION

A wiring board according to one aspect of the present invention has a substrate, a conductive pattern formed over the substrate, an electronic component mounted to the substrate and having an electrode on one or more surfaces of the electronic component. The electrode on the surface of the electronic component is connected to the conductive pattern by a via hole. The thickness of the electrode on the surface is less than the thickness of the conductive pattern connected to the electrode by means of the via hole.

"Mounted to the substrate" includes a case in which the entire electronic component is embedded completely inside the substrate, as well as a case in which part of the electronic component is positioned in a hollow section formed in the substrate. In short, it is sufficient if at least part of the electronic component is arranged in the substrate.

Also, "the thickness of an electrode" and "the thickness of a conductive pattern" indicate average values if such thicknesses are not uniform.

Another aspect of the present invention is a method for manufacturing a wiring board which includes forming a conductive pattern over a substrate, forming an electronic component having an electrode on at least one surface of the electrode, electrode having a thickness reduced to less than the thickness of the conductive pattern, mounting the electronic component to the substrate, and forming a via hole connecting the conductive pattern and the electrode of the electronic component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8 is a table showing the results of the simulations;

FIGS. 9A-9B are graphs showing the results of the simulations;

DETAILED DESCRIPTION OF THE EMBODIMENTS

Figure 1:
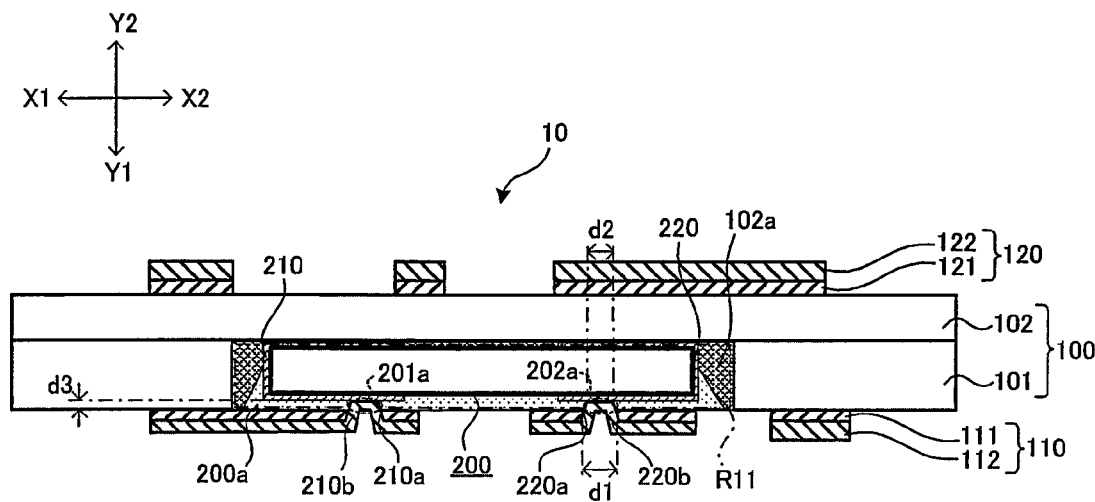
FIG. 1 is a cross-sectional view showing a wiring board according to the First Embodiment of the present invention.

The embodiments will now be described with reference to the accompanying drawings, wherein like reference numerals designate corresponding or identical elements throughout the various drawings.

First Embodiment

As shown in FIG. 1, wiring board (10) with a built-in electronic component of the present embodiment has substrate (100), wiring layers (110, 120) as conductive patterns, and electronic component (200).

Substrate (100) is formed with rectangular insulation layers (101, 102) made of cured prepreg, for example. Such prepreg is preferred to contain reinforcing material such as glass fabric or aramid fabric impregnated with resin. Such reinforcing material is a material having a smaller thermal expansion coefficient than the primary material (prepreg). Insulation layer (101) has space (R11) configured to correspond to the outer shape of electronic component (200). Space (R11) will become a hollow section of substrate (100).

The configuration, material, etc., of substrate (100) may be modified according to usage requirements or other requirements. For example, as for prepreg, the following may also be used: base material such as glass fabric or aramid fabric impregnated with resin such as epoxy resin, bismaleimide triazine (BT) resin, imide resin (polyimide), allyl polyphenylene ether resin (A-PPE resin) or the like. In addition, instead of prepreg, liquid or film-type thermosetting resins or thermoplastic resins may be used. As for such thermosetting resins, for example, epoxy resin, imide resin (polyimide), BT resin, allyl polyphenylene ether resin, aramid resin or the like may be used. Also, as for thermoplastic resins, for example, liquid crystal polymer (LCP), PEEK resin, PTFE resin (fluororesin) or the like may be used. Such resins are preferred to be selected according to requirements in view of insulation, dielectric properties, heat resistance and mechanical properties. In addition, such resins may contain additives such as curing agents, stabilizers, filler or the like. Other than those, resin-coated copper foil (RCF) may also be used instead of prepreg.

On the surfaces (both surfaces) of substrate (100), wiring layers (110, 120) are formed. On the lower surface of substrate (100) (the side indicated by arrow (Y1)), wiring layer (110) is formed; and on the upper surface of substrate (100) (the side indicated by arrow (Y2)), wiring layer (120) is formed.

Wiring layer (110) is formed with first wiring layer (111) and second wiring layer (112). Also, wiring layer (120) is formed with first wiring layer (121) and second wiring layer (122). First wiring layers (111, 121) are made of copper foil, for example. Second wiring layers (112, 122) are made of copper-plated film, for example. Since wiring layers (110, 120) include first wiring layers (111, 121) (metal foil) and second wiring layers (112, 122) (plated metal film), adhesiveness will be enhanced between first wiring layers (111, 121) and insulation layers (101, 102), and they will seldom suffer delamination. The thickness of wiring layers (110, 120) is 15-40 µm, for example. The material, thickness and other aspects of wiring layers (110, 120) may be modified according to usage requirements or the like.

In space (R11) of insulation layer (101), electronic component (200) is arranged, which has substantially the same thickness as insulation layer (101). Insulative resin (102a) that has seeped (drained) from insulation layers (101, 102), along with adhesive (200a) to secure electronic component (200), is filled in the boundary portions between electronic component (200) and substrate (100). Resin (102a) completely envelopes electronic component (200). In doing so, electronic component (200) is protected by resin (102a) and is fixed to a predetermined position.

Adhesive (200a) is made from insulative material such as non-conductive liquid polymer (NCP). In insulative adhesive (200a), taper-shaped via holes (201a, 202a) are formed. Specifically, in first wiring layer (111) and adhesive (200a), taper-shaped penetrating holes (210a, 220a) are formed to be connected to electronic component (200). Via holes (201a, 202a) are formed as part of penetrating holes (210a, 220a). In addition, on the wall and bottom surfaces of penetrating holes (210a, 220a), conductors (210b, 220b) which are contiguous to second wiring layer (112) are formed. Therefore, on the wall and bottom surfaces of via holes (201a, 202a) which are part of penetrating holes (210a, 220a), conductors (210b, 220b) are also formed respectively. Via hole (201a) and conductor (210b), and via hole (202a) and conductor (220b) each form a conformal via. Electronic component (200) and wiring layer (110) are electrically connected by means of such conformal vias. Lower-side (the side indicated by arrow (Y1)) opening diameter (d1) of penetrating holes (210a, 220a) is 60 µm, for example; and upper-side (the side indicated by arrow (Y2)) opening diameter (d2) of penetrating holes (210a, 220a) is 50 µm, for example. The configuration of penetrating holes (210a, 220a) is not limited to tapering, but any other configuration may be employed.

The diameter of via holes (201a, 202a) (for example, upper-side opening diameter (d2) of penetrating holes (210a, 220a)) is preferred to be set at 30-90 µm, more preferably at 50-60 µm. If the diameter of via hole (201a) or (202a) is too small, connection reliability will decrease. On the other hand, if the diameter of via hole (201a) or (202a) is too large, the required area for terminal electrodes (electrode pads) (210, 220) of electronic component (200) will increase, thus making it hard to highly integrate electronic component (200). However, if the diameter of via holes (201a, 202a) is set in the above range, wiring board (10) with a built-in electronic component may be manufactured with fewer such drawbacks.

Depth (d3) of via holes (201a, 202a) is preferred to be set at 1-10 µm, more preferably at 5 µm. If the depth of via holes (201a, 202a) is too small, it is difficult to make them uniform. On the other hand, if the depth of via holes (201a, 202a) is too large, it takes more time to form them, thus creating drawbacks in terms of manufacturing efficiency. However, if the depth of via holes (201a, 202a) is set in the above range, wiring board (10) with a built-in electronic component may be manufactured with fewer such drawbacks.

Figure 2:
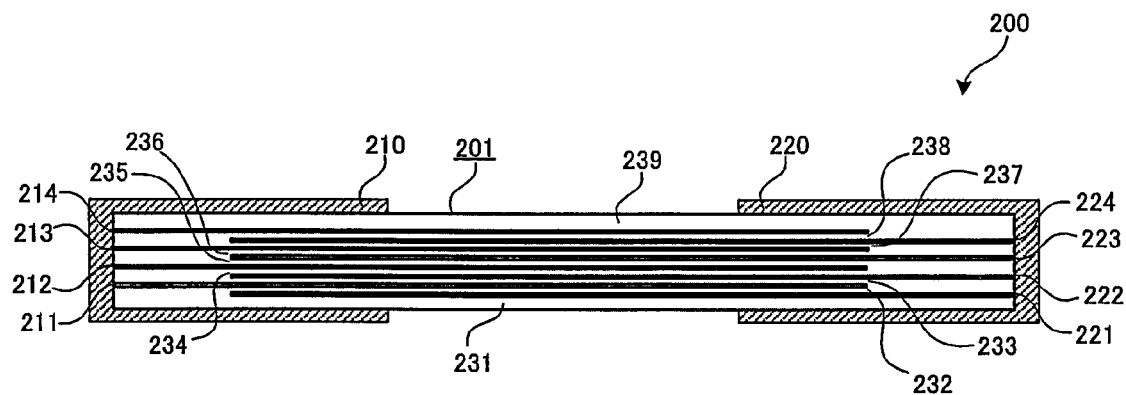
FIG. 2 is a cross-sectional view showing an electronic component to be built into the wiring board.

Electronic component (200) is a chip capacitor, for example. Specifically, as its cross-sectional structure is shown in FIG. 2, for example, electronic component (200) is formed with capacitor body (201) and U-shaped terminal electrodes (210, 220) (electrode pads). Capacitor body (201) is formed, for example, by alternately laminating multiple dielectric layers (231-239), made of ceramic, for example, with multiple conductive layers (211-214) and (221-224). Terminal electrodes (210, 220) are formed on both ends of capacitor body (201) respectively. Thus, both ends of capacitor body (201), specifically, their lower surfaces, side surfaces and upper surfaces, are covered by terminal electrodes (210, 220) respectively. Since the side surfaces of capacitor body (201) are covered by terminal electrodes (210, 220), efficiency in generating heat will increase. On the other hand, the central portion of capacitor body (201) is exposed. Terminal electrodes (210, 220) are fixed to wiring layer (110) (especially to first wiring layer (111)) using adhesive (200a). In doing so, terminal electrodes (210, 220) are firmly secured. Electronic component (200) is not limited to a chip capacitor, but other passive components such as a chip resistor may also be used for electronic component (200).

As shown in FIG. 1, while being built into substrate (100), the lower surfaces of terminal electrodes (210, 220) in electronic component (200) are connected to wiring layer (110) by means of via hole (201a) and conductor (210b) as well as via hole (202a) and conductor (220b) respectively. Here, second wiring layer (112) and conductors (210b, 220b) are made of copper-plated film, for example. Thus, reliability in the connected portions is high between electronic component (200) and wiring layer (110). Also, by forming plated metal film on the surface of terminal electrode (210) of electronic component (200), reliability in the connected portions will further increase between electronic component (200) and wiring layer (110).

Meanwhile, the central section of capacitor body (201) (FIG. 2) is coated with resin (102a). Since the section (central section) where relatively fragile ceramic portions are exposed in capacitor body (201) is coated with resin (102a), capacitor body (201) is protected by such resin (102a).

Figure 3:
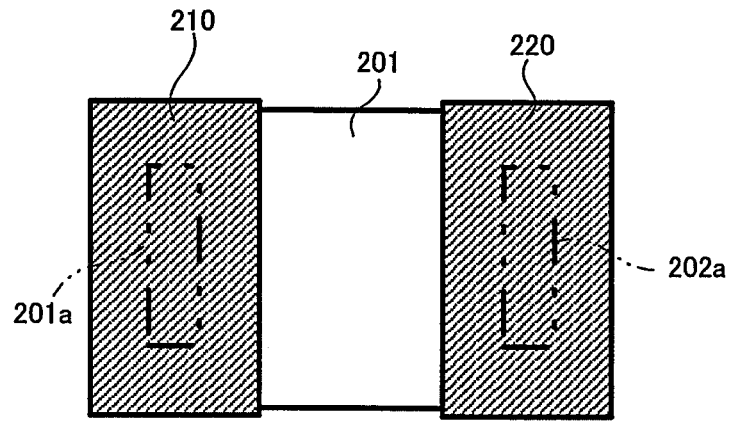
FIG. 3 is a view showing a positional relationship between terminal electrodes of the electronic component and via holes.

As shown in FIG. 3, for example, via holes (201a, 202a) are positioned at the center of terminal electrodes (210, 220) of electronic component (200) respectively.

Figure 4A:
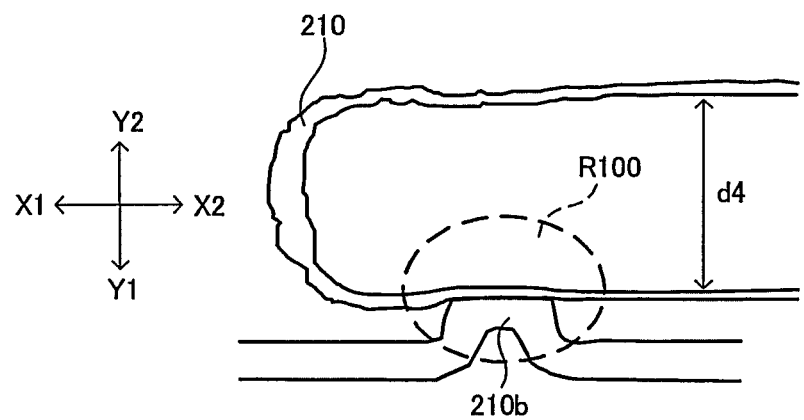
FIG. 4A is a magnified view of the electronic component to be built into the wiring board.
Figure 4B:
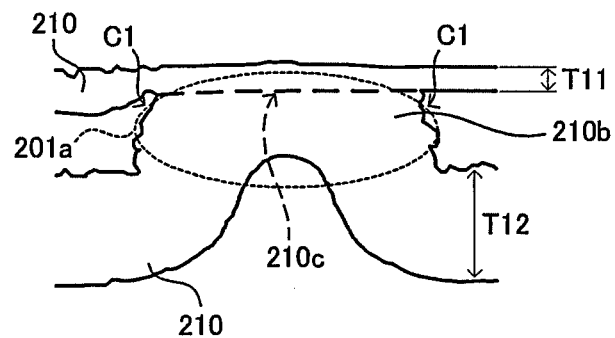
FIG. 4B is a magnified view showing part of FIG. 4A.

FIG. 4A is a magnified view showing part of electronic component (200); and FIG. 4B is a magnified view showing region (R100) of FIG. 4A. Electronic component (200) is configured to be 1 mm by 1 mm square and thickness (d4) of electronic component (200) is set at 100-150 µm, for example. Via holes (201a, 202a) are connected to the lower surface (the side indicated by arrow (Y1)) of electronic component (200).

In addition, boundary portions (C1) between the bottom and wall surfaces of via holes (201a, 202a) are rounded. Accordingly, the degree of bend from the bottom toward the wall surface becomes gradual, and plating performance improves when forming conductors (210b, 220b) (plated metal film).

For the sake of convenience in providing descriptions, only the side of terminal electrode (210) is shown in FIGS. 4A and 4B. However, the same applies to the side of electrode (220).

The surfaces of terminal electrodes (210, 220) are roughened. Since connection surface (210c) of terminal electrode (210) and conductor (210b) is roughened, adhesiveness is enhanced between terminal electrode (210) and conductor (210b).

The thickness of terminal electrodes (210, 220) (especially lower-side thickness (T11) where conductors (210b, 220b) are connected) is preferred to be set at 2-15 µm, more preferably at 5 µm.

The thinner terminal electrode (210) or (220) becomes, the weaker its strength becomes. Thus, if terminal electrode (210) or (220) is too thin, when via hole (201a) or (202a) is formed by a laser or the like, one concern is that such drilling may not stop at terminal electrode (210) or (220), but may bore through terminal electrode (210) or (220).

Figure 5A:
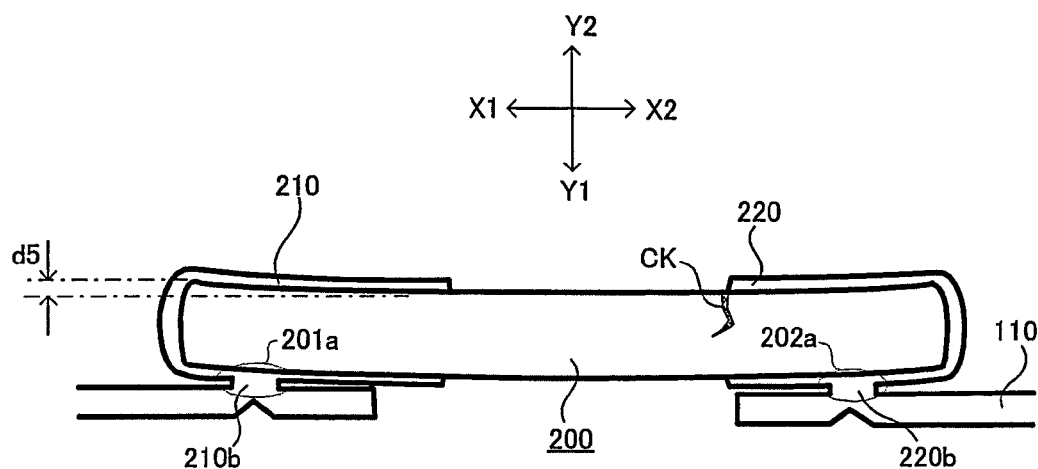
FIGS. 5A-5B are views illustrating how cracks occur in an electronic component.
Figure 5B:
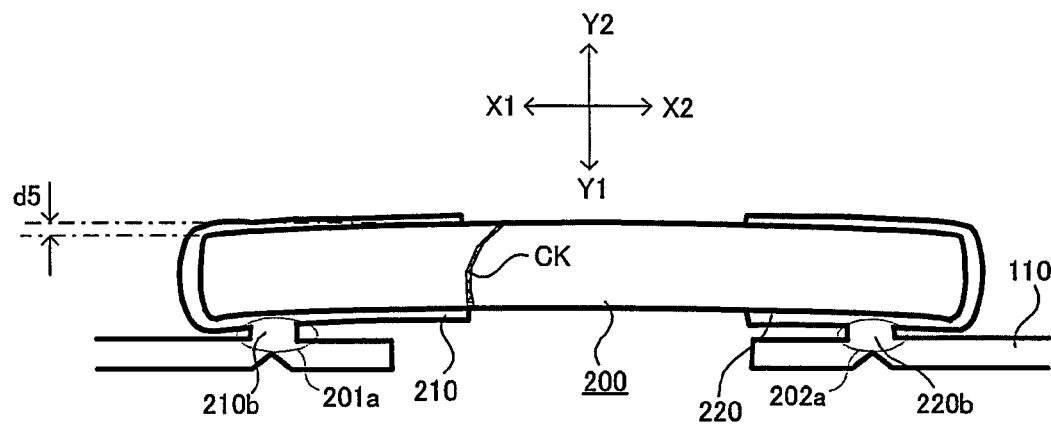

On the other hand, if terminal electrode (210) or (220) is too thick, as shown in FIG. 5A or 5B, another concern is that cracks (CK) may occur in the boundary portions between where the electrode is formed and where the electrode is not formed in electronic component (200). If electronic component (200) becomes more compact, electronic component (200) may tend to warp to protrude downward (toward the side indicated by arrow (Y1)), or protrude upward (toward the side indicated by arrow (Y2)). The warping amount (d5) of electronic component (200) is in the range of 5 to 15 µm, for example.

Besides, as terminal electrodes (210, 220) become thicker, wiring board (10) with a built-in electronic component will become larger accordingly, thus causing drawbacks in terms of mounting spaces or the like.

However, if the thickness of terminal electrodes (210, 220) is in the above range, wiring board (10) with a built-in electronic component may be manufactured with fewer drawbacks in terms of strength, cracks or the like.

Thickness (T12) of wiring layer (110) is preferred to be set at 15-40 µm, more preferably at 30 µm.

If wiring layer (110) is too thin, its electric resistance increases, which is not preferred in terms of energy efficiency or the like.

On the other hand, if wiring layer (110) is too thick, it takes a longer time to form the wiring layer, which is not preferred in terms of manufacturing efficiency. Especially, when wiring layer (110) is formed by plating, drawbacks such as difficulty in forming uniform plated metal film, or difficulty in forming or removing plating resist may result.

However, if the thickness of wiring layer (110) is in the above range, wiring board (10) with a built-in electronic component may be manufactured with fewer drawbacks in terms of energy efficiency and manufacturing efficiency.

Also, the ratio between the thickness of terminal electrode (210) or (220) (especially thickness (T11) on the lower side) and thickness (T12) of wiring layer (110) is preferred to be set so that the thickness of terminal electrode (210) or (220) is less than the thickness of wiring layer (110). Especially, the thickness of terminal electrode (210) or (220) is preferred to be set at half (½) or smaller than half the thickness of wiring layer (110). If the ratio is set as such, by forming terminal electrode (210) or (220) thinner, cracks or the like may be suppressed in electronic component (200). Meanwhile, by making the thickness of wiring layer (110) thicker to compensate for the reduced thickness of terminal electrode (210) or (220), a high level of heat dissipation may be maintained.

Regarding cracks (CK) shown in FIGS. 5A and 5B, simulation results and the mechanism of how cracks occur identified by the inventors are described with reference to FIGS. 6-11B.

Simulations were conducted on samples Leg (1)-Leg (6). In samples Leg (1)-Leg (4), warping in capacitor body (201) was not observed. In sample Leg (5), a warping degree (d5) (FIG. 5A) of 12 µm was observed, and capacitor body (201) warped to be concave. In sample Leg (6), a warping degree (d5) (FIG. 5B) of 12 µm was observed, and capacitor body (201) warped to be convex. The dimensions of such samples Leg (1)-Leg (6) shown in FIG. 6 were as follows: thickness (T3) of capacitor body (201): 150 µm; width (T4) of capacitor body (201): 1,000 µm; and distance (T5) between terminal electrode (210) and terminal electrode (220): 380 µm. Vertical thickness (T1) of terminal electrodes (210, 220) was: 25.0 µm in sample Leg (1); 12.5 µm in sample Leg (2); 6.25 µm in sample Leg (3); 3.13 µm in sample Leg (4); 12.5 µm in sample Leg (5); and 12.5 µm in sample Leg (6). Side thickness (T2) of terminal electrodes (210, 220) was: 32.5 µm in sample Leg (1); 20.0 µm in sample Leg (2); 13.75 µm in sample Leg (3); 10.63 µm in sample Leg (4); 20.0 µm in sample Leg (5); and 20.0 µm in sample Leg (6). Young's modulus (GPa) was 129.5 in capacitor body (201) and 97.2 in copper. Poisson's ratio was 0.28 in capacitor body (201) and 0.3 in copper. In the above simulations, for Young's modulus and Poisson's ratio, values in silicon were substituted, since silicon has values approximating those of barium titanate, which is the primary material of capacitor body (201).

Figure 6:
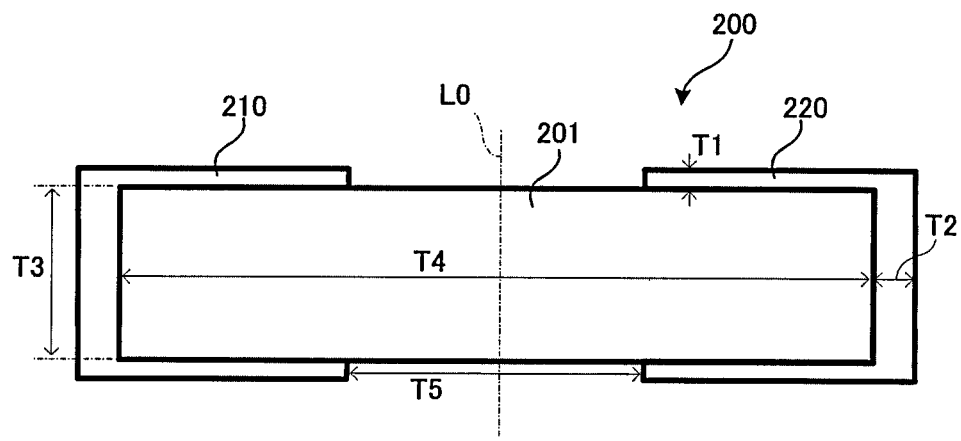
FIG. 6 is a view showing a sample to be used in simulations.
Figure 7:
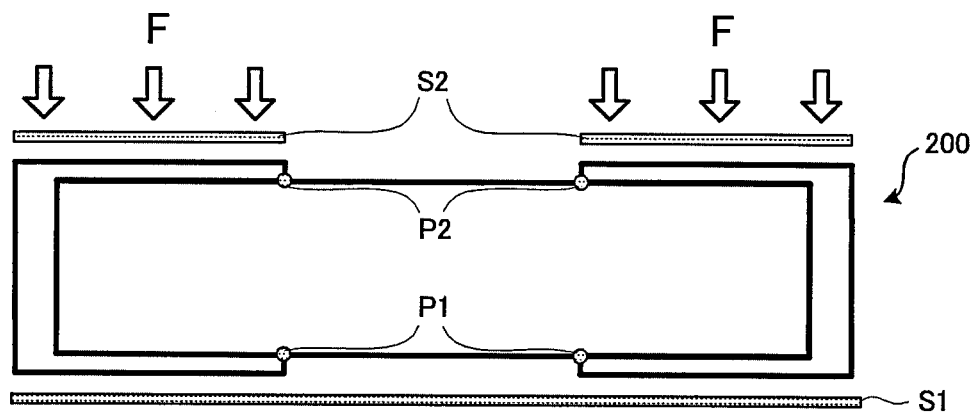
FIG. 7 is a view illustrating a method for the simulations.

The person who took measurements set a virtual pressure value of 0.000001 Pa and calculated the stress at lower measurement spots (P1) and at upper measurement spots (P2) when vertical pressure (F) was added to pressing surface (S2) opposite mounting surface (S1) as shown in FIG. 7. At that time, under such conditions that coefficients of thermal expansion (CTE) from temperature change were not considered and the variables only in horizontal direction were fixed, two dimensional measurements were taken by steady-state approximation on a half model symmetrical at center line (L0) (FIG. 6). Measurement points (P1) and (P2) were those where damage actually occurred (see FIGS. 5A and 5B); namely, the step portions between capacitor body (201) and terminal electrode (210) or (220) (especially contact spots with capacitor body (201)).

The simulation results of samples Leg (1)-Leg (6) are shown in the table in FIG. 8 and the graphs in FIGS. 9A and 9B. As shown in FIG. 9A, at both measurement points (P1) and (P2), the thinner the vertical thickness (T1) of terminal electrode (210) or (220) becomes, the less stress is received. Also, as shown in FIG. 9B, in samples Leg (1) and Leg (6), the risk of damage from warped capacitor body (201) increases at the upper portion and decreases at the lower portion. When sample Leg (5) and sample Leg (6) are compared, the risk of damage is higher in sample Leg (6) at both the upper and lower portions.

Figure 10:
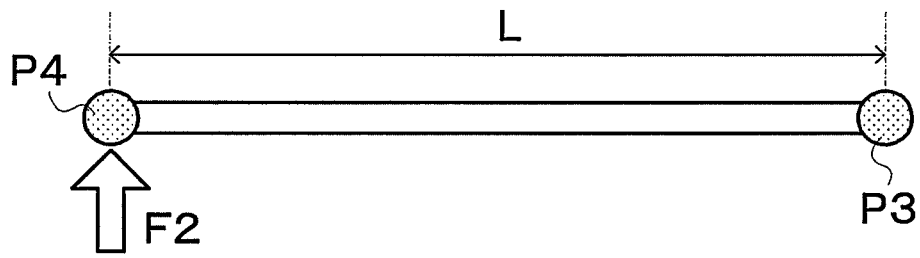
FIG. 10 is a view illustrating the mechanism of how cracks occur.

The inventors think the results of such simulations were caused by a moment. A moment is a force to rotate an object. For example, as shown in FIG. 10, if fixed point (P3) is fixed, and if force (F2) is added to point of application (P4), which is located at distance (L) from fixed point (P3), in a direction perpendicular to the direction toward fixed point (P3) (horizontal direction), then a moment of magnitude (F2×L) will be generated.

Figure 11A:
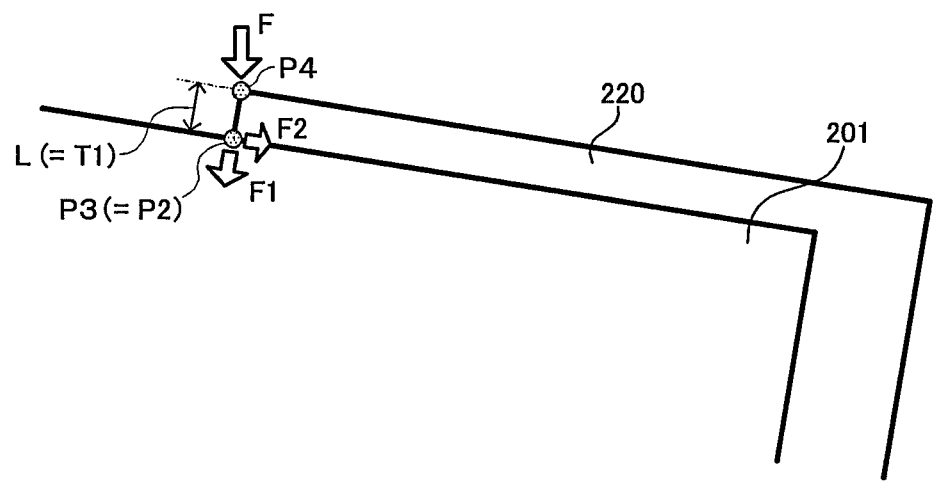
FIGS. 11A-11B are views illustrating the mechanism of how cracks occur.

For example, in the simulation of sample Leg (6) in which capacitor body (201) warps to be convex, force (F1) in a direction of the thickness of terminal electrode (210) or (220), along with force (F2) in a horizontal direction, is added to measurement point (P2) as a component force of pressure (F) as shown in FIG. 11A. Accordingly, a moment is generated and cracks (CK) tend to occur. When pressure (F) is constant, the thicker the vertical thickness (T1) of terminal electrode (210) or (220) (especially the thickness at the step portions) which corresponds to distance (L) (FIG. 10), the greater the moment. If the moment increases, the stress becomes greater, and cracks (CK) are more likely to occur. The same applies to sample Leg (5) in which capacitor body (201) warps to be concave.

Figure 11B:
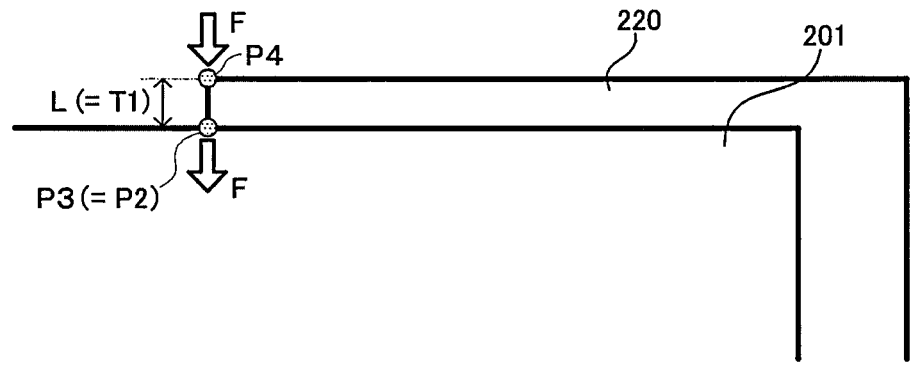

On the other hand, in the simulations in samples Leg (1)-Leg (4) in which warping was absent in capacitor body (201), when pressure (F) (FIG. 7) was added to point of application (P4) at the edge of terminal electrode (210) or (220), no moment was generated at measurement point (P2) corresponding to fixed point (P3) as shown in FIG. 11B. Thus, the force from pressure (F) was conveyed entirely to measurement point (P2). However, even in samples Leg (1)-Leg (4) without warping, if pressure is added from outside or the like, capacitor body (201) may deform. Accordingly, the same as in samples Leg (5) and Leg (6), force (F2) in a horizontal direction will be added to measurement point (P2) as a component force of pressure (F) as previously shown in FIG. 11A. Therefore, a moment will be generated, increasing the likelihood of cracks (CK).

The inventors think that due to the above mechanism, the thinner the vertical thickness (T1) of terminal electrode (210) or (220), the less the stress and the lower the likelihood of cracks (CK). In addition, cracks (CK) may occur less in sample Leg (5) than in sample Leg (6).

Figure 12:
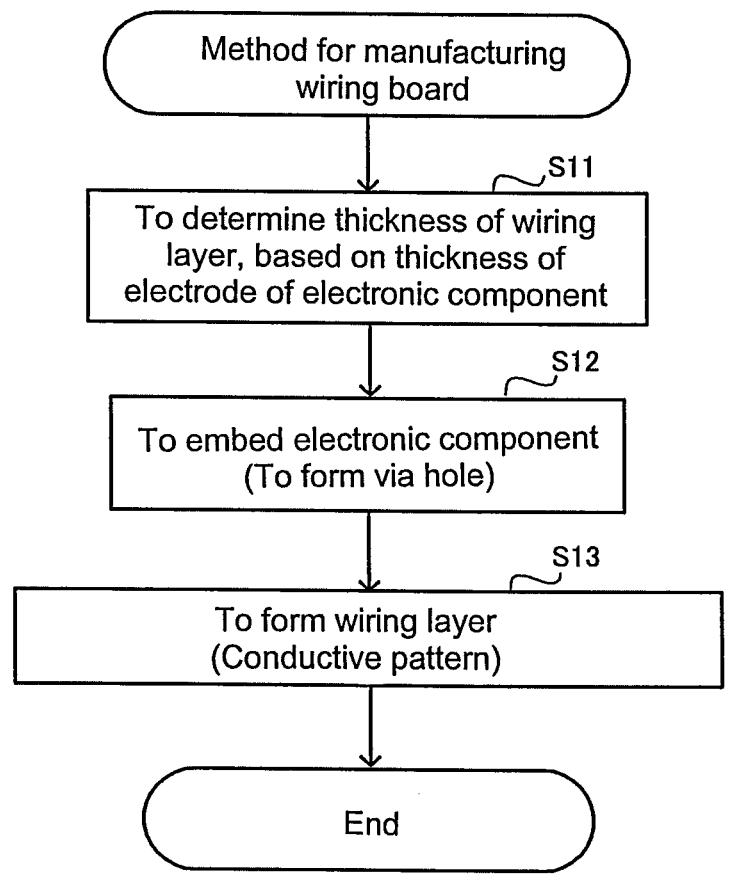
FIG. 12 is a flow chart showing the steps of a method for manufacturing a wiring board according to the First Embodiment of the present invention.

When manufacturing wiring board (10) with a built-in electronic component, for example, a series of processes shown in FIG. 12 are carried out.

In step (S11), thickness (T12) of wiring layer (110) are determined based on thickness (T11) of terminal electrode (210) or (220) of electronic component (200) to be mounted (see FIG. 4B). Specifically, the ratio (T11/T12) of thickness (T11) and thickness (T12) is set at half or smaller than half.

In step (12), electronic component (200) is embedded by taking the steps shown in FIGS. 13A-13D and FIGS. 14A-14C, for example.

Figure 13A:
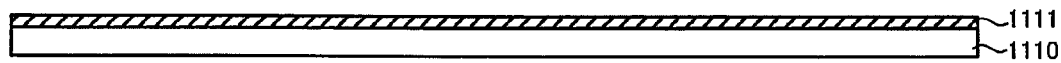
FIGS. 13A-13D are views illustrating steps to arrange an electronic component on a carrier.

More specifically, carrier (1110) having conductive film (1111) on one side is prepared as shown in FIG. 13A, for example. Carrier (1110) and conductive film (1111) are both made of copper, for example. However, carrier (1110) is thicker than conductive film (1111).

Figure 13B:
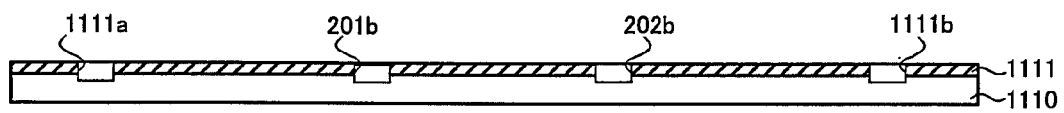

Holes are made using a UV laser or the like to penetrate only conductive film (1111) as shown in FIG. 13B. Accordingly, opening portions (201b, 202b, 1111a, 1111b) are formed. Opening portions (1111a, 1111b) are used as alignment targets.

Figure 13C:
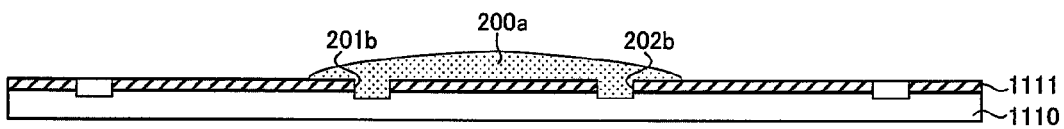

As shown in FIG. 13C, adhesive is applied (200a) in the central section of carrier (1110) and conductive film (1111) including at least opening portions (201b, 202b) using NCP coating, for example. By doing so, adhesive (200a) is filled in opening portions (201b, 202b).

Figure 13D:
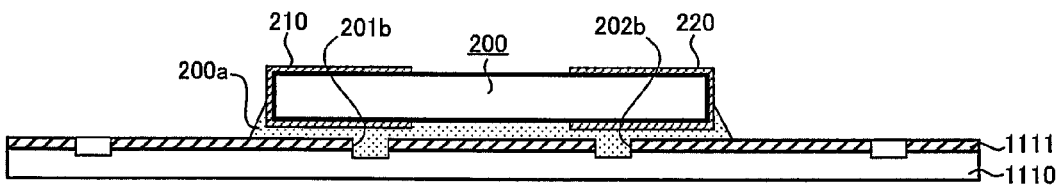

Electronic component is mounted (200) over opening portions (201b, 202b) as shown in FIG. 13D.

Specifically, electronic component (200) with terminal electrodes (210, 220) is prepared. The surfaces of terminal electrodes (210, 220) are roughened. After electronic component (200) is mounted on adhesive (200a), electronic component (200) is fixed to that position by adding pressure and heat, for example. During that time, electronic component (200) is pressed down so that the thickness of adhesive (200a) will become uniform under electronic component (200) and voids will not remain inside. Such a process is important to secure connection reliability of via holes (201a, 202a) in the later process. The surfaces of terminal electrodes (210, 220) are usually roughened when those electrodes are formed. However, according to requirements, the surfaces may be roughened using chemicals or the like after the electrodes are formed.

Figure 14A:
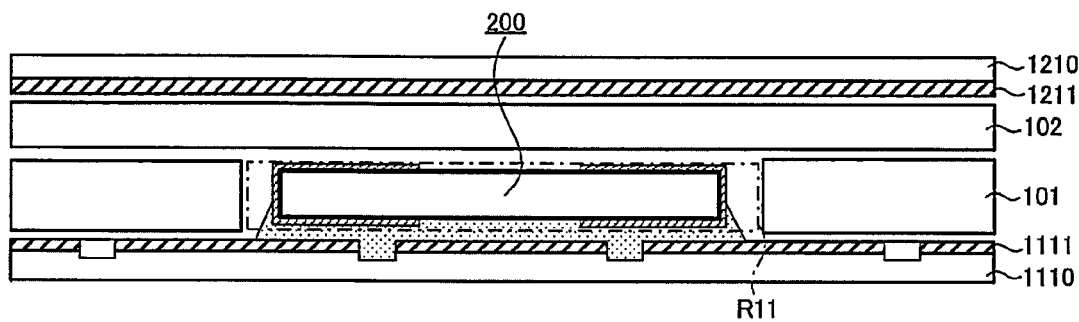
FIGS. 14A-14C are views illustrating steps to build (embed) an electronic component into a substrate.

As shown in FIG. 14A, for example, on carrier (1110) and conductive film (1111) made of copper, for example, insulation layer (101) made of prepreg, for example, is formed to be set horizontal to electronic component (200); and further on the top, insulation layer (102) made of prepreg, for example, and conductive film (1211) and carrier (1210) made of copper, for example, are each arranged. Electronic component (200) is arranged in space (R11) positioned at the center of insulation layer (101).

Figure 14B:
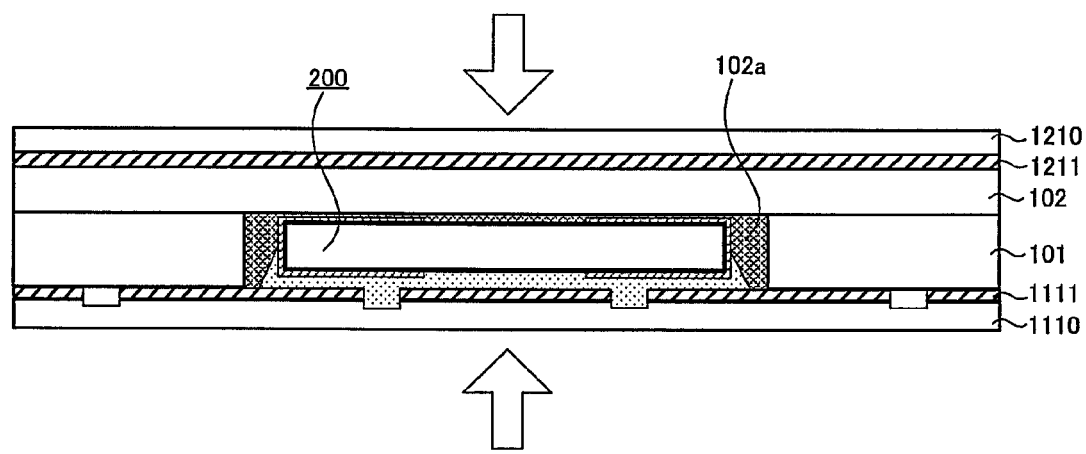

Pressure-pressing (for example, thermal pressing) is conducted as shown in FIG. 14B, for example. In doing so, resin (102a) is squeezed out from insulation layers (101, 102). Namely, by such pressing, resin (102a) seeps from (drains from) each prepreg that forms insulation layers (101, 102) and is filled between electronic component (200) and insulation layer (101) (boundary portions). After that, insulation layers (101, 102) are cured through a thermal process, for example.

Figure 14C:
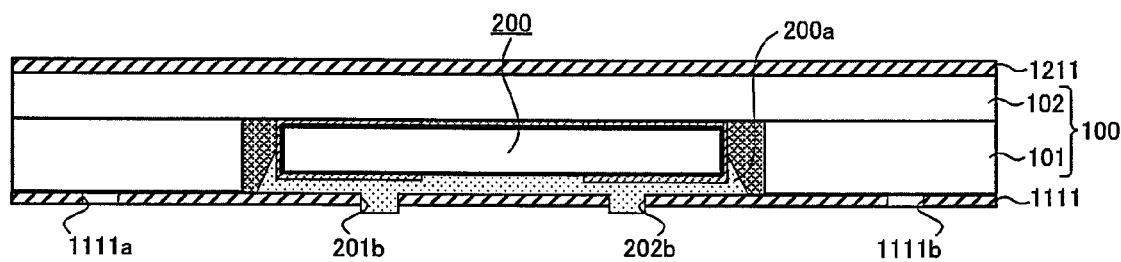

Carriers (1110, 1210) are removed as shown in FIG. 14C, for example. In doing so, conductive films (1111, 1211) and adhesive (200a) filled in opening portions (201b, 202b) are exposed.

Accordingly, electronic component (200) is embedded in substrate (100). Electronic component (200) is located in the hollow section (space (R11)) of substrate (100).

Figure 15A:
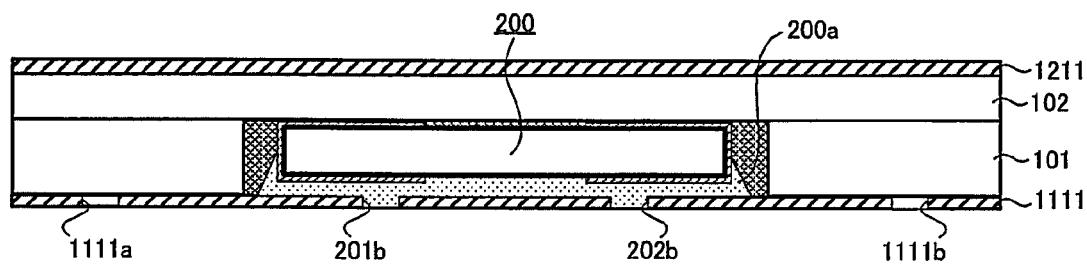
FIGS. 15A-15C are views illustrating steps to form a conductive pattern.
Figure 15B:
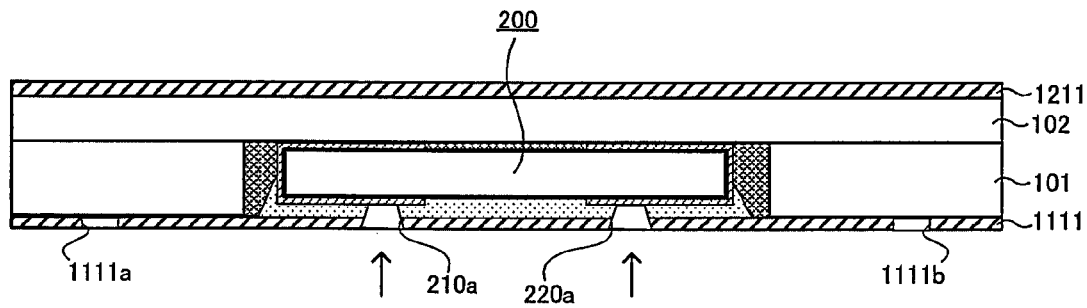
Figure 15C:
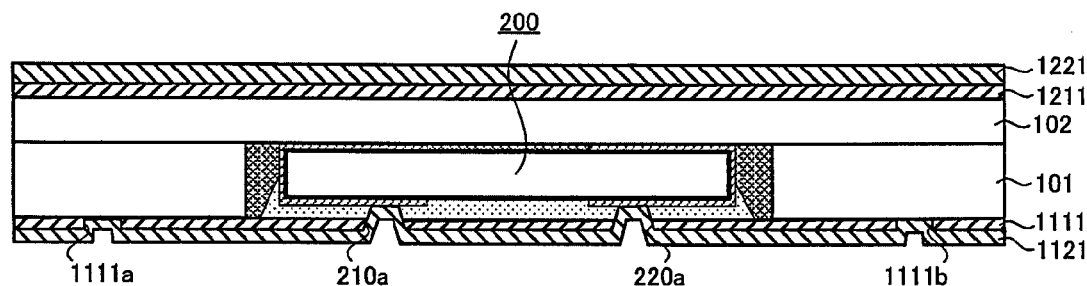

In step (S13) of FIG. 12, conductive patterns are formed by the steps shown in FIGS. 15A-15C, for example. Conductive patterns are formed to have the thickness determined in step (S11).

More specifically, $CO_2$ laser cleaning and desmearing are conducted as shown in FIG. 15A, for example. In doing so, adhesive (200a) on the surface of conductive film (1111) is removed. However, the step for such cleaning and desmearing is not requisite, and may be omitted.

As shown in FIG. 15B, for example, penetrating holes (210a, 220a) are formed in conductive film (1111) and adhesive (200a) to reach electronic component (200) using a laser or the like. In doing so, via holes (201a, 202a) are formed as parts of penetrating holes (210a, 220a).

As shown in FIG. 15C, for example, PN plating (such as chemical copper plating and copper electroplating) is performed to form conductive films (1121, 1221) (copper-plated films) on the surfaces of conductive films (1111, 1211) including penetrating holes (210a, 220a) and opening portions (1111a, 1111b).

A predetermined lithography process (preliminary treatment, lamination, exposure and development, etching, removal of the film, inner-layer inspection and so forth) is conducted to pattern conductive films (1111, 1121, 1211, 1221) in such a configuration as shown in FIG. 1. In doing so, first wiring layer (111) and second wiring layer (112) (wiring layer 110) along with first wiring layer (121) and second wiring layer (122) (wiring layer 120) are formed. Instead of using such a subtractive method to form conductive patterns, another method, in which plating resist is formed on insulation layers (101, 102) and wiring layers (110, 120) are formed by pattern plating (such as chemical copper plating and copper electroplating), a so-called semi-additive (SAP) method may also be used. Alternatively, through-holes may be formed by forming openings that penetrate insulation layers (101, 102) prior to forming conductive patterns, and then by performing plating in such openings while forming wiring layers (110, 120).

Electrodes are formed by chemical gold plating or the like according to requirements, and conducts external processing, warping correction, conductivity inspection, exterior inspection and final inspection. In doing so, wiring board (10) with a built-in electronic component is completed as shown in FIG. 1.

In the present embodiment, the ratio (T11/T12) of thickness (T11) of terminal electrode (210) or (220) of electronic component (200) and thickness (T12) of wiring layer (110) is set at one or smaller, preferably at ½ or smaller.

By making relatively thick wiring layer (110), heat dissipation efficiency increases in wiring board (10) with a built-in electronic component. Thus, wiring board (10) with a built-in electronic component shows excellent connection reliability in via holes (201a, 202a) in a heat cycle in the range of −25° C. to 140° C., for example. As a result, via holes (201a, 202a) with smaller diameters may be achieved.

Also, since the thickness of terminal electrode (210) or (220) is set in a proper range, cracks or the like may be prevented while the strength of electronic component (200) is maintained highly. As a result, even with thin electronic component (200), its reliability increases when being built into a substrate.

According to the manufacturing method of the present embodiment, wiring board (10) with a built-in electronic component having the above features may be easily manufactured following simplified steps.

Second Embodiment

Figure 16A:
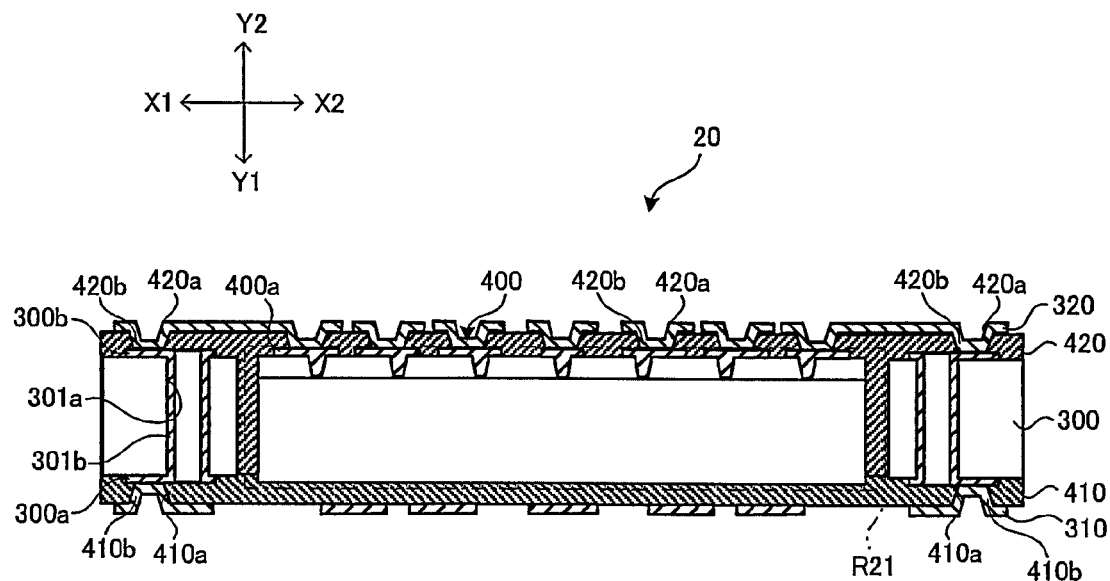
FIG. 16A is a cross-sectional view showing a wiring board according to the Second Embodiment of the present invention.

As shown in FIG. 16A, wiring board (20) with a built-in electronic component of the present embodiment has substrate (300), wiring layers (310, 320) as conductive patterns, and electronic component (400). Electronic component (400) is built into wiring board (20) as its built-in component. Electronic component (400) is an IC chip with predetermined integrated circuits. Electronic component (400) has multiple terminal electrodes (400a) (electrode pads) on one surface. The surfaces of terminal electrodes (400a) are roughened. The IC chip referred to here includes a so-called wafer-level CSP, which is formed by forming protective films, terminals, etc., on a wafer, further rewiring and so forth, then by separating the wafers into units. Also, electronic component (400) may have terminal electrodes (400a) on both surfaces.

Substrate (300) is made from, for example, epoxy resin. Epoxy resin is preferred to contain reinforcing material such as glass fiber or aramid fiber impregnated with resin. The reinforcing material has a smaller thermal expansion coefficient than primary material (epoxy resin). The thickness of substrate (300) is set, for example, at 0.1 mm. However, the configuration, thickness, material and so forth of substrate (300) may be modified according to usage requirements or the like.

Substrate (300) has through-holes (301a). On the inner walls of through-holes (301a), conductive film (301b) is formed. In addition, substrate (300) has space (R21) whose configuration corresponds to the external shape of electronic component (400).

On the surfaces (both surfaces) of substrate (300), wiring layers (300a, 300b) are formed respectively. Wiring layer (300a) and wiring layer (300b) are electrically connected to each other by means of conductive film (301b) formed in through-holes (301a).

On the lower surface of substrate (300) (the side indicated by arrow (Y1)), insulation layer (410) and wiring layer (310) are laminated in that order. Also, on the upper surface of substrate (300) (the side indicated by arrow (Y2)), insulation layer (420) and wiring layer (320) are laminated in that order. Insulation layers (410, 420) are made of, for example, cured prepreg. Also, wiring layers (310, 320) are made of, for example, copper-plated film.

Electronic component (400) is arranged in space (R21). In the boundary portions between electronic component (400) and substrate (300), insulation layer (420) is filled.

Insulation layer (410) is formed to cover the lower surface of electronic component (400) and wiring layer (300a). Here, at the predetermined spots, via holes (410a) in a tapered shape are formed to be connected to wiring layer (300a). On the wall and bottom surfaces of via holes (410a), conductor (410b) is formed; via holes (410a) and conductor (410b) form conformal vias. Then, by means of such conformal vias, wiring layer (300a) and wiring layer (310) are electrically connected.

Meanwhile, insulation layer (420) is formed to cover the upper surface of electronic component (400), wiring layer (300b) and terminal electrodes (400a). Here, at predetermined spots, via holes (420a) are formed in a tapered shape to be connected to wiring layer (300b) and terminal electrodes (400a). On the wall and bottom surfaces of via holes (420a), conductor (420b) is formed; via holes (420a) and conductor (420b) form conformal vias. Then, wiring layer (300b) and terminal electrodes (400a) are electrically connected to wiring layer (320) by means of such conformal vias. Here, wiring layer (320) and conductor (420b) are made of, for example, copper-plated film. Therefore, reliability is high in the connection areas between electronic component (400) and wiring layer (320).

Electronic component (400) is completely enveloped by insulation layers (410, 420). In doing so, electronic component (400) is protected by insulation layers (410, 420) while being fixed to a predetermined position.

Figure 16B:
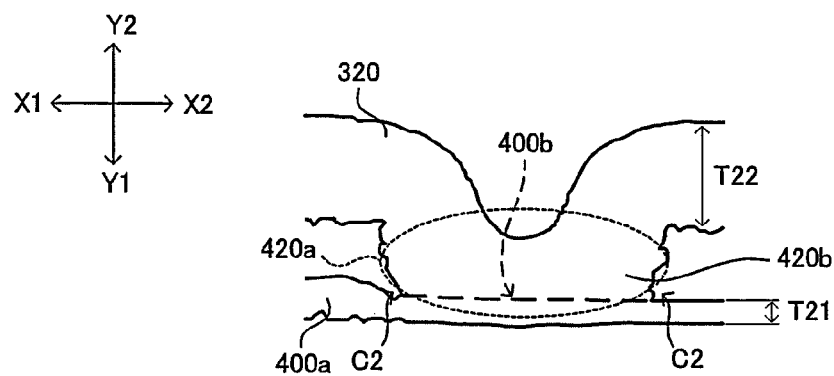
FIG. 16B is a magnified view of an electronic component to be built into the wiring board.

In electronic component (400), the same as in electronic component (200), as shown in FIG. 16B (a view corresponding to FIG. 4B), for example, thickness (T21) of terminal electrodes (400a) is preferred to be set at 2-15 μm, more preferably at 5 μm. Thickness (T22) of wiring layer (320) is preferred to be set at 15-40 μm, more preferably at 30 μm. In addition, the ratio of thickness (T21) of terminal electrodes (400a) and thickness (T22) of wiring layer (320) is preferred to be set so that the thickness of terminal electrodes (400a) is less than the thickness of wiring layer (320). Especially, it is preferred that the thickness of terminal electrodes (400a) will be half (½) or smaller than half the thickness of wiring layer (320).

Also, boundary portions (C2) between the bottom and wall surfaces of via holes (420a) are rounded. Thus, the degree of bend from the bottom toward the wall surface becomes gradual, and plating performance improves when forming conductor (420b) (plated metal film).

Here, for the sake of convenience, only one terminal electrode (400a) is shown in the drawing, and the structure surrounding it has been described. However, the rest of terminal electrodes (400a) are the same.

The same as wiring board (10) with a built-in electronic component may be manufactured by carrying out wiring board (20) with a built-in electronic component, for example, a series of processes shown previously in FIG. 12. Specifically, in step (S11), thickness (T22) of wiring layer (320) is determined based on thickness (T21) of terminal electrodes (400a) of electronic component (400) to be mounted (see FIG. 16B). More specifically, the ratio of thickness (T21) and thickness (T22) (T21/T22) is set to be half or smaller than half.

In step (S12), electronic component (400) is embedded by taking steps shown in FIGS. 17A-17D and FIGS. 18A-18C, for example.

Figure 17A:
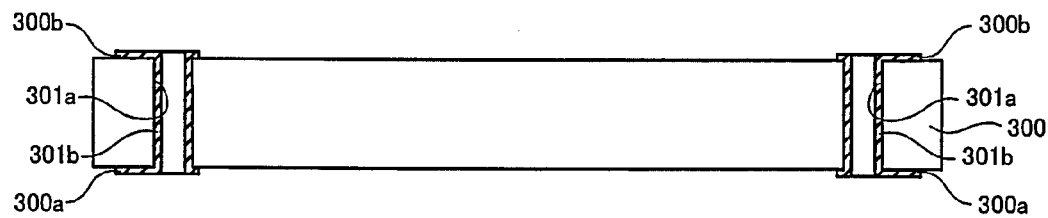
FIG. 17A is a view illustrating a step to prepare a substrate.

More specifically, substrate (300) having through-holes (301a) and conductive film (301b) along with wiring layers (300a, 300b) is prepared as shown in FIG. 17A, for example. Substrate (300) corresponds to a core of wiring board (20) with a built-in electronic component.

Figure 17B:
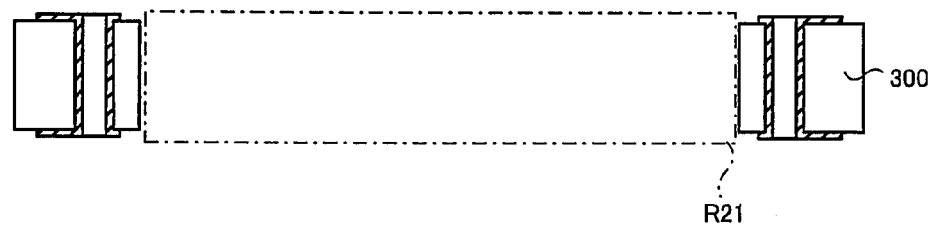
FIG. 17B is a view illustrating a step to form a space to build an electronic component into the substrate.

Space (R21) is formed in substrate (300) by making a hollow section using a laser or the like as shown in FIG. 17B, for example.

Figure 17C:
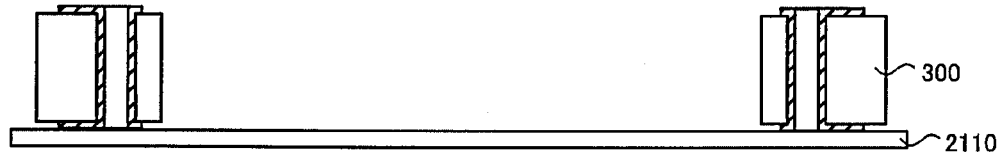
FIG. 17C is a view illustrating a step to mount the substrate on a carrier.

As shown in FIG. 17C, for example, carrier (2110) made of polyethylene terephthalate (PET) is arranged, for example, on one side of substrate (300). Carrier (2110) is adhered to substrate (300) by lamination, for example.

Figure 17D:
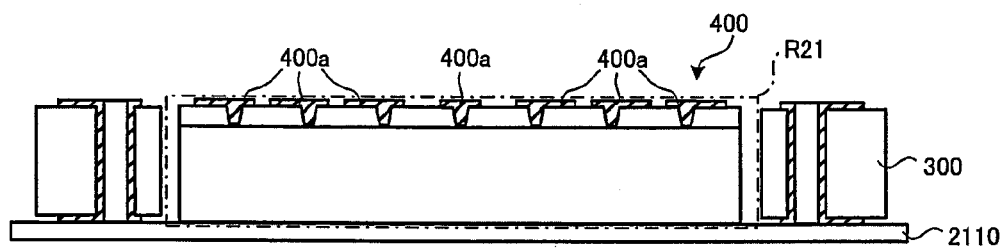
FIG. 17D is a view illustrating a step to arrange an electronic component on the carrier.

As shown in FIG. 17D, electronic component (400) is mounted on carrier (2110) at room temperature, for example, (specifically on space (R21)) in such a way that terminal electrodes (400a) will face upward (the side opposite carrier (2110)). The surfaces of terminal electrodes (400a) are roughened. Surfaces of terminal electrodes (400a) are usually roughened when the electrodes are formed. However, if necessary, the surfaces may be roughened using chemicals or the like after the electrodes were formed.

Figure 18A:
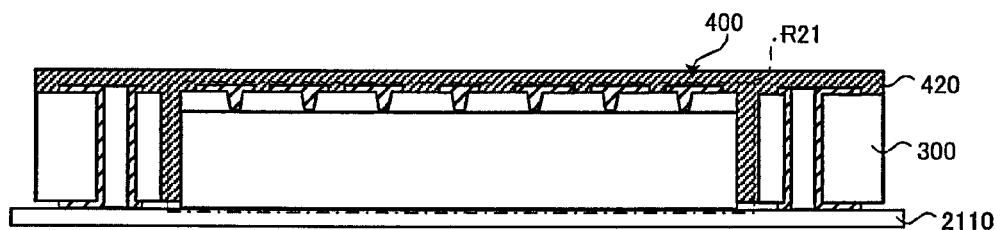
FIG. 18A is a view illustrating a step to build (embed) the electronic component into the substrate.

As shown in FIG. 18A, insulation layer (420) is formed using a vacuum laminator, for example, to cover electronic component (400) and substrate (300). In doing so, terminal electrodes (400a) are covered with insulation layer (420). Furthermore, insulation layer (420) is melted by heat and filled in space (R21). Accordingly, electronic component (400) is fixed in a predetermined position.

Figure 18B:
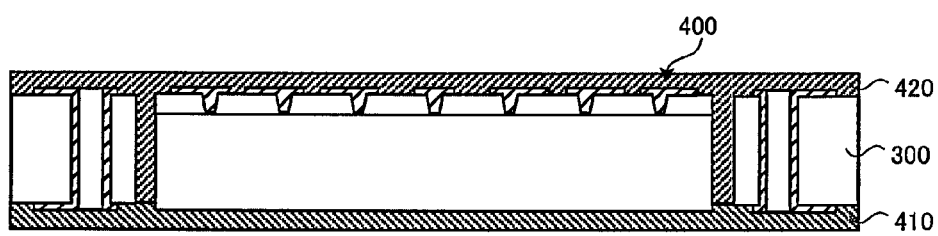
FIG. 18B is a view illustrating a step to build the electronic component into the substrate.

Carrier (2110) is peeled and removed from the lower surface (the surface opposite insulation layer (420)) of substrate (300). As shown in FIG. 18B, for example, insulation layer (410) is formed on the lower surface of substrate (300). In doing so, electronic component (400) is embedded in substrate (300).

Figure 18C:
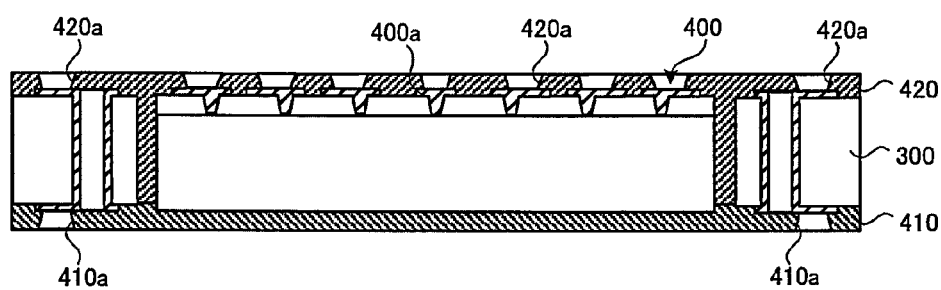
FIG. 18C is a view illustrating a step to form via holes.

As shown in FIG. 18C, via holes (410a, 420a) are formed in insulation layers (410, 420) using a laser or the like.

In step (S13) of FIG. 12, conductive patterns, namely, wiring layers (310, 320) are formed on electronic component (400) by a semi-additive method, for example. Specifically, both surfaces of electronic component (400) are covered with patterned plating resist, and electrolytic plating is performed selectively on the areas not covered by such resist. In doing so, wiring layer (320) is formed to have a thickness determined at step (S11). Instead of a semi-additive method, a subtractive method may also be used to form wiring layers (310, 320).

Electrodes are formed by chemical gold plating or the like according to requirements, and external processing, warping correction, conductivity inspection, exterior inspection and final inspection are carried out. Accordingly, wiring board (20) with a built-in electronic component is complete as shown previously in FIG. 16A.

The same effects described in the First Embodiment may be achieved in wiring board (20) with a built-in electronic component and its manufacturing method according to the present embodiment.

So far, the wiring boards and manufacturing methods according to the embodiments of the present invention have been described. However, the present invention is not limited to the above embodiments. For example, the present invention may be carried out by modifying it as follows.

Figure 19:
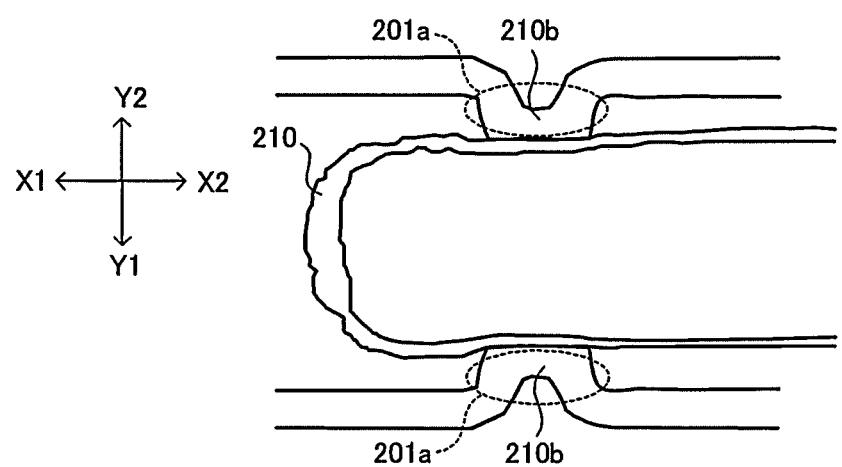
FIG. 19 is a view showing another example of via holes.

For example, as shown in FIG. 19 (only the side of via hole (201a) is shown for the sake of convenience), via holes (201a, 202a) may be formed on both surfaces of electronic component (200). The same applies to electronic component (400).

Figure 20A:
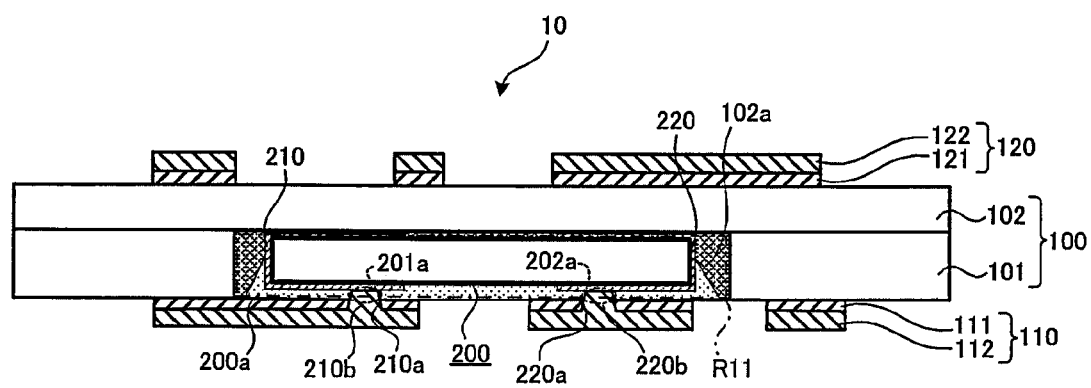
FIG. 20A is a view showing an example of a wiring board using filled vias.
Figure 20B:
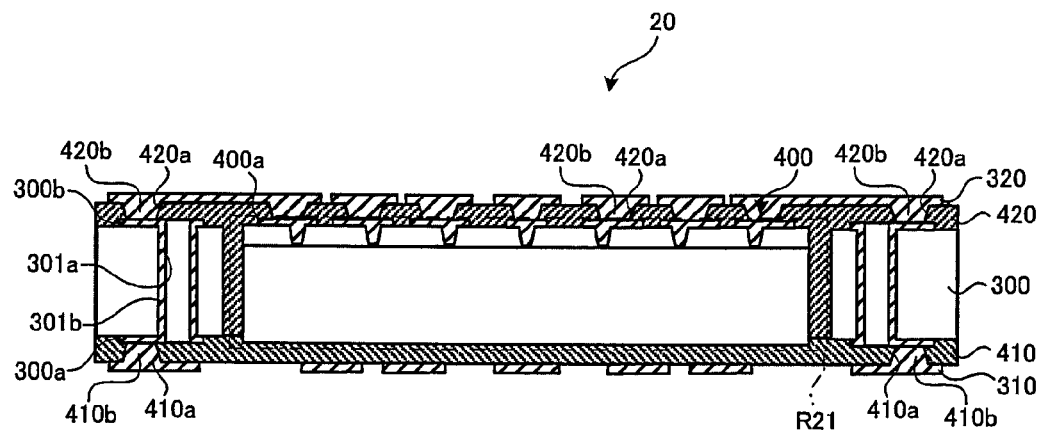
FIG. 20B is a view showing another example of a wiring board using filled vias.

Via holes (201a, 202a, 410a, 420a) are not limited to forming conformal vias. As shown in FIGS. 20A, 20B, they may form filled vias which are filled with conductors (210b, 220b, 410b, 420b), for example.

Figure 21A:
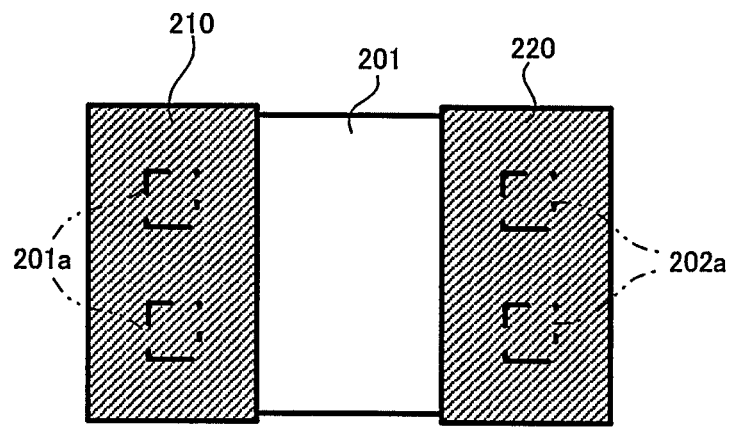
FIGS. 21A-21C are views showing other examples of how terminal electrodes of an electronic component and via holes are configured.
Figure 21B:
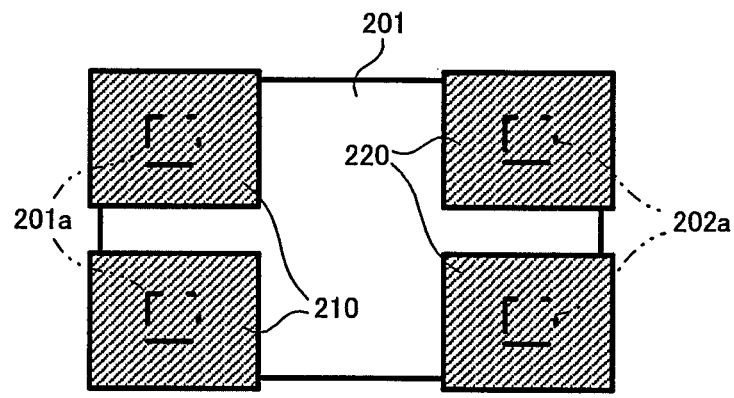
Figure 21C:
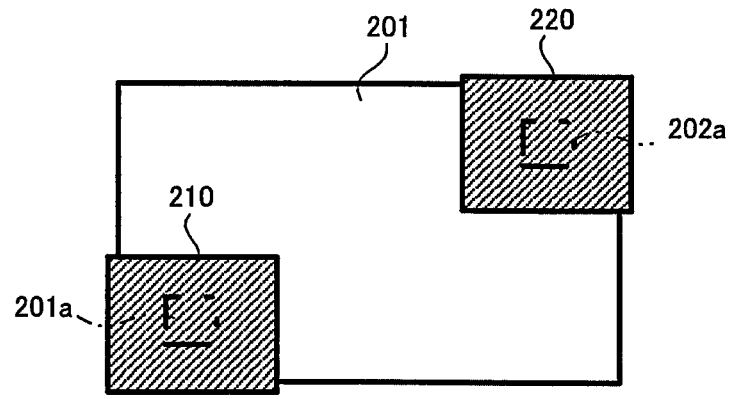

The number of electrodes of the electronic component and via holes along with their configurations may be modified to any number and configuration. For example, in the First Embodiment, via holes (201a, 202a) are formed in terminal electrodes (210, 220) to be one on one. However, as shown in FIG. 21A (a view corresponding to FIG. 3), for example, multiple (such as two) via holes (201a, 202a) may be formed in each one of terminal electrodes (210, 220). In addition, as shown in FIG. 21B, for example, terminal electrodes (210, 220) along with via holes (201a, 202a) may be formed at the four corners of capacitor body (201). Also, as shown in FIG. 21C, for example, terminal electrodes (210, 220) along with via holes (201a, 202a) may be formed to be positioned diagonally on capacitor body (201). All the same applies to the Second Embodiment.

Figure 22A:
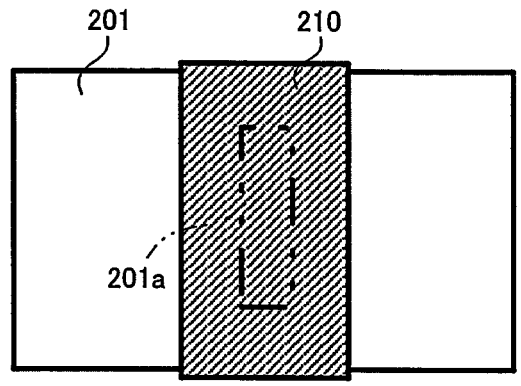
FIGS. 22A-22C are views showing yet other examples of how terminal electrodes of an electronic component and via holes are configured.
Figure 22B:
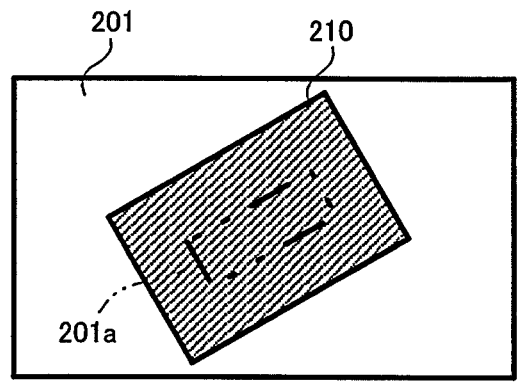
Figure 22C:
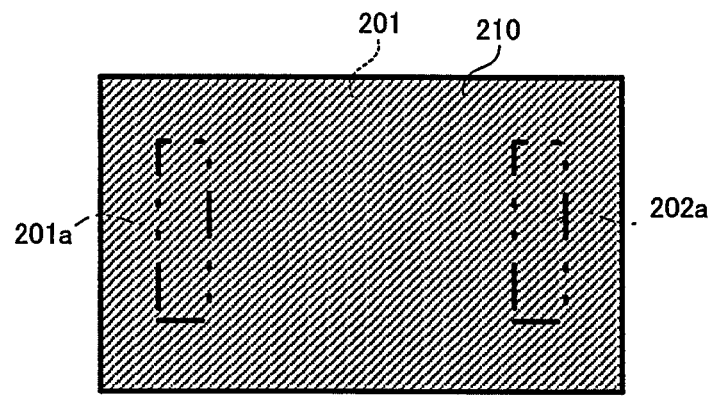

In the First Embodiment, via holes (201a, 202a) are connected to the edges of electronic component (200). However, the present invention is not limited to such. For example, as shown in FIG. 22A, terminal electrode (210) and via hole (201a) may be arranged on the central portion of capacitor body (201). Alternatively, as shown in FIG. 22B, for example, terminal electrode (210) and via hole (201a) may be arranged obliquely to the sides of capacitor body (201). Also, as shown in FIG. 22C, for example, terminal electrode (210) may be arranged on the entire surface of capacitor body (201).

The configuration of terminal electrodes (210, 220) of electronic component (200) is not limited to a U-shape, but a pair of flat-plate electrodes may sandwich capacitor body (201).

Any type of electronic component may be used as electronic components (200, 400); for example, active components such as an IC chip or the like, and passive components such as a capacitor, resistor, coil or the like may be used.

In the above embodiments, the quality, size, the number of layers and so forth of each layer may be modified.

For example, to reduce the manufacturing costs, wiring board (10) or (20) with a built-in electronic component having a simple structure as shown previously in FIG. 1 or FIG. 16A may be preferred. However, the present invention is not limited to such. For example, to achieve high functionality, after the structure shown in FIG. 1 or FIG. 16A is complete, a lamination process may be further carried out to make it an even multilayer (for example, eight layers) wiring board with a built-in electronic component.

The order of the steps in the above embodiments may be changed within a scope that will not deviate from the gist of the present invention. Also, unnecessary processes may be omitted according to usage requirements or the like.

So far, the embodiments of the present invention have been described. However, it should be understood that various modifications and combinations necessary for design convenience and other requirements will be included in the invention described in the "claims" and in the scope of the present invention corresponding to the specific examples described in the "embodiments of the present invention."

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board comprising:
   a substrate having an opening;
   a conductive pattern formed over the substrate, the conductive pattern comprising a first wiring layer formed directly on a surface of the substrate and a second wiring layer formed over the first wiring layer; and
   an electronic component positioned inside the opening of the substrate and having an electrode on at least one surface of the electronic component,
   wherein the first wiring layer has a penetrating hole formed therein such that the penetrating hole penetrates the first wiring layer and reaches the electrode of the electronic component, a via hole is formed as part of the penetrating hole and positioned inside the opening of the substrate, the second wiring layer is extended along a surface of the via hole such that a conductor is formed on the surface of the via hole, the electrode is connected to the conductive pattern through the conductor which is in contact with the electrode, and the electrode on the surface of the electronic component has a thickness less than a thickness of the conductive pattern connected to the electrode through the conductor of the via hole.

2. The wiring board according to claim 1, wherein the electronic component has a first surface facing the conductive pattern, a second surface opposite to the first surface, and a side surface, the electrode is a U-shaped terminal electrode covering a portion of the first surface, a portion of the second surface, and the side surface, and the thickness of the electrode on the first surface and on the second surface of the electronic component is less than the thickness of the conductive pattern.

3. The wiring board according to claim 1, wherein the thickness of the electrode is half or smaller than half the thickness of the conductive pattern.

4. The wiring board according to claim 1, wherein the thickness of the electrode is in a range of 2-15 μm.

5. The wiring board according to claim 1, wherein the thickness of the conductive pattern is in a range of 15-40 μm.

6. The wiring board according to claim 1, wherein the electronic component is a passive component.

7. The wiring board according to claim 6, wherein the electronic component is a chip capacitor.

8. The wiring board according to claim 1, wherein the electrode covers the side surface of the electronic component.

9. The wiring board according to claim 1, wherein the via hole has a boundary portion between bottom and wall surfaces of the via hole, and the boundary portion is rounded.

10. The wiring board according to claim 1, further comprising an adhesive on which the electronic component is mounted,
    wherein the adhesive fills a space between the electrode and the conductive pattern, and the via hole is formed in the adhesive.

11. The wiring board according to claim 1, wherein the via hole forms a conformal via.

12. The wiring board according to claim 1, wherein the via hole forms a filled via.

13. The wiring board according to claim 1, wherein a resin is filled between the substrate and the electronic component.

14. The wiring board according to claim 1, wherein the conductive pattern comprises a metal foil and a plated metal film.

15. The wiring board according to claim 1, wherein the via hole has a diameter of 30-90 μM.

16. The wiring board according to claim 1, wherein the substrate is made of a first insulation layer and a second insulation layer formed on the first insulation layer, the first insulation layer has the opening formed therein, and the via hole having a depth of 1-10 μm from the surface of the substrate to a bottom of the via hole is positioned inside the opening of the first insulation layer.

* * * * *